(12) United States Patent
Wu et al.

(10) Patent No.: US 12,230,170 B2
(45) Date of Patent: Feb. 18, 2025

(54) DISPLAY PANEL APPLIED TO LARGE SIZE OR HIGH PIXEL DENSITY TILING DISPLAY

(71) Applicant: Industrial Technology Research Institute, Hsinchu (TW)

(72) Inventors: Ming-Hsien Wu, Tainan (TW); Yao-Jun Tsai, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 505 days.

(21) Appl. No.: 17/565,461

(22) Filed: Dec. 30, 2021

(65) Prior Publication Data
US 2023/0186795 A1 Jun. 15, 2023

(30) Foreign Application Priority Data
Dec. 15, 2021 (TW) .................. 110147049

(51) Int. Cl.
*G09F 9/302* (2006.01)
*H01L 25/075* (2006.01)
(Continued)

(52) U.S. Cl.
CPC ........ *G09F 9/3026* (2013.01); *H01L 25/0753* (2013.01); *H01L 27/156* (2013.01); *H01L 33/486* (2013.01); *H01L 33/62* (2013.01)

(58) Field of Classification Search
CPC . G09F 9/3026; H01L 25/0753; H01L 27/156; H01L 33/486; H01L 33/62
See application file for complete search history.

(56) References Cited

U.S. PATENT DOCUMENTS

| 9,741,785 B2 | 8/2017 | Bower et al. |
| 11,024,614 B2 | 6/2021 | Wu et al. |

(Continued)

FOREIGN PATENT DOCUMENTS

| CN | 112669714 | 4/2021 |
| EP | 2769407 | 5/2017 |

(Continued)

OTHER PUBLICATIONS

Jp2006145890, machine translation, (Year: 2006).*
(Continued)

*Primary Examiner* — Tracie Y Green
(74) *Attorney, Agent, or Firm* — JCIPRNET

(57) ABSTRACT

A display panel including a bottom plate, a plurality of display modules, and a plurality of connection pixel packages is provided. The display modules are tiled in an array arrangement on the bottom plate. Each of the display modules includes a circuit substrate and a plurality of display pixels. The circuit substrate includes a plurality of connection electrodes. The display pixels are disposed on the circuit substrate and at least one of the display pixels has at least one second pixel unit. Each of the connection pixel packages includes at least one first pixel unit. The connection pixel packages are disposed on the connection electrodes of the adjacent circuit substrates to connect the display modules. A light emitting surface of the at least one first pixel unit and a light emitting surface of the at least one second pixel unit are coplanar.

15 Claims, 8 Drawing Sheets

(51) Int. Cl.
*H01L 27/15* (2006.01)
*H01L 33/48* (2010.01)
*H01L 33/62* (2010.01)

(56) References Cited

U.S. PATENT DOCUMENTS

| | | | | |
|---|---|---|---|---|
| 2016/0179453 A1* | 6/2016 | Jepsen | .................. | G06F 3/1446 345/1.3 |
| 2019/0012956 A1* | 1/2019 | Li | ............................ | G09G 3/32 |
| 2019/0131344 A1* | 5/2019 | Li | ....................... | H01L 25/0753 |
| 2022/0415873 A1* | 12/2022 | Chung | .................. | H01L 25/162 |

FOREIGN PATENT DOCUMENTS

| | | | | | |
|---|---|---|---|---|---|
| JP | 2004191487 | | 7/2004 | | |
| JP | 2006145890 | | 6/2006 | | |
| JP | 2006145890 A | * | 6/2006 | ........... | G09F 9/3026 |
| JP | 2007192977 | | 8/2007 | | |
| JP | 2015194515 | | 11/2015 | | |
| JP | 2018087928 | | 6/2018 | | |
| JP | 2019075528 | | 5/2019 | | |
| JP | 2019514217 | | 5/2019 | | |
| TW | 201721618 | | 6/2017 | | |
| TW | I676851 | | 11/2019 | | |
| TW | 202131508 | | 8/2021 | | |
| WO | WO-2013059757 A1 | * | 4/2013 | ................ | G01J 1/44 |
| WO | 2016105811 | | 6/2016 | | |

OTHER PUBLICATIONS

Mark Aston et al., "Design of large-area OLED displays utilizing seamless tiled components," Journal of the Society for Information Display, Aug. 2007, pp. 535-540.

"Office Action of Taiwan Counterpart Application", issued on Jan. 24, 2022, p. 1-p. 3.

"Office Action of Japan Counterpart Application", issued on Mar. 7, 2023, p. 1-p. 4.

* cited by examiner

DISPLAY PANEL APPLIED TO LARGE SIZE OR HIGH PIXEL DENSITY TILING DISPLAY

CROSS-REFERENCE TO RELATED APPLICATION

This application claims the priority benefit of Taiwan application serial no. 110147049, filed on Dec. 15, 2021. The entirety of the above-mentioned patent application is hereby incorporated by reference herein and made a part of this specification.

TECHNICAL FIELD

The technical field relates to a display panel.

BACKGROUND

In known technology, display panels can be divided into discrete display modules and tiling display modules. Discrete display modules can be defined as those with pixel spacing less than or equal to 250 μm, with high pixel and period density. However, due to the high production difficulty, only small-size panels are currently available for demonstration. Tiling display modules can be defined as those with pixel spacing less than or equal to 400 μm, and can only be used for panels with higher period density. Due to yield and cost issues, mass production specifications cannot be achieved on a single panel. Therefore, there is a lack of solutions for large size panels and high pixel period density.

SUMMARY

One of exemplary embodiments provides a display panel. The display panel is capable of being applied to large size or high pixel density tiling displays.

One of exemplary embodiments provides a display panel. The display panel includes a bottom plate, a plurality of display modules, and a plurality of connection pixel packages. The display modules are tiled in an array arrangement on the bottom plate. Each of the display modules includes a circuit substrate and a plurality of display pixels. The circuit substrate includes a plurality of connection electrodes. The display pixels are disposed on the circuit substrate. At least one of the display pixels has at least one second pixel unit. Each of the connection pixel packages includes at least one first pixel unit. The connection pixel packages are disposed on the connection electrodes of the adjacent circuit substrates to connect the display modules. A light emitting surface of the at least one first pixel unit and a light emitting surface of the at least one second pixel unit are coplanar.

Based on the above, in the display panel of the disclosure, the connection pixel packages include the at least one first pixel unit, the at least one second pixel unit is disposed on the display modules, the display modules are disposed on the bottom plate, and the connection pixel packages are tiled and disposed on the adjacent circuit substrates to form the display panel. As a result, there are pixel units that can display images between adjacent display modules, capable of being applied to large size or high pixel density tiling displays.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate embodiments exemplary and, together with the description, serve to explain the principles of the disclosure.

DETAILED DESCRIPTION OF DISCLOSED EMBODIMENTS

Figure 1A:
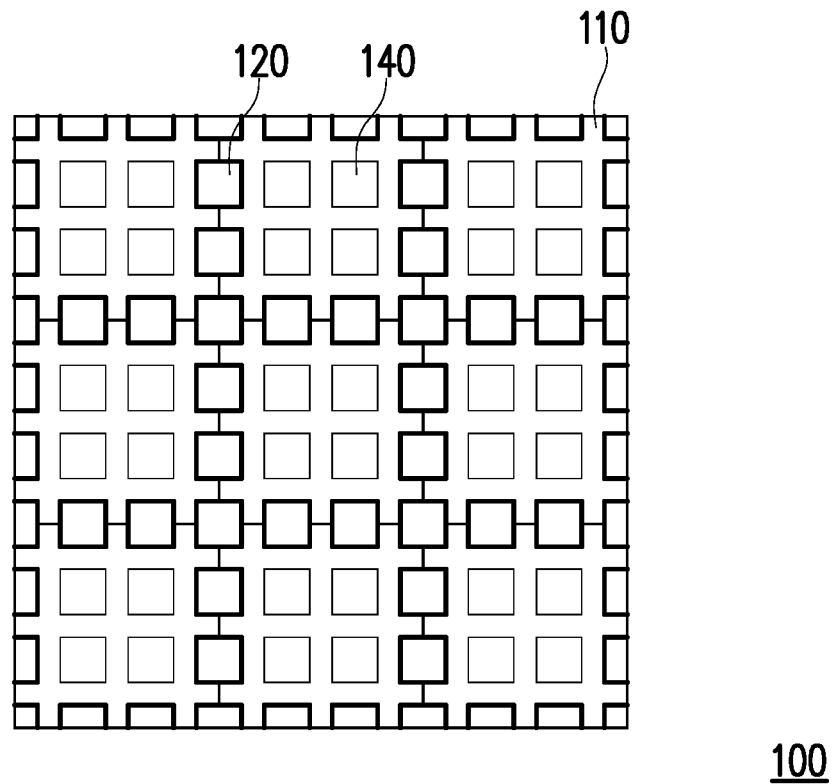
FIG. 1A and FIG. 1B are respectively a schematic top view and a schematic cross-sectional view of a display panel according to an embodiment of the disclosure.
Figure 1B:
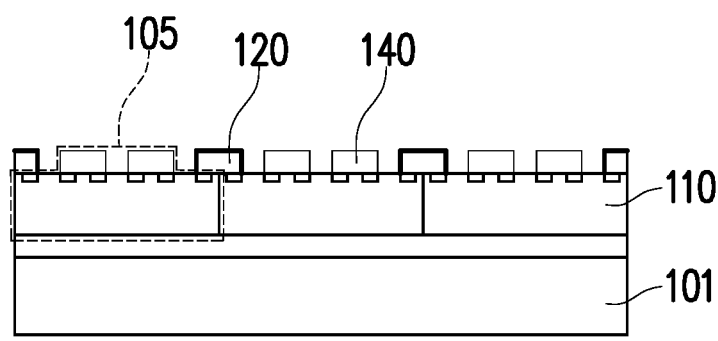

FIG. 1A and FIG. 1B are respectively a schematic top view and a schematic cross-sectional view of a display panel according to an embodiment of the disclosure. Referring to FIG. 1A and FIG. 1B, this embodiment provides a display panel 100. The display panel 100 includes a bottom plate 101, a plurality of display modules 105, and a plurality of connection pixel packages 120 (shown in bold lines). The bottom plate 101 is located at a bottom side, and the display modules 105 are disposed on the bottom plate 101 and are tiled in an array arrangement, as shown in FIG. 1B. The display module 105 includes a circuit substrate 110 having a plurality of connection electrodes 112 (as shown in FIG. 7B) and a plurality of display pixels 140 (shown in fine lines). The connection pixel packages 120 are disposed on the connection electrodes 112 of the adjacent circuit substrates 110 to connect the display modules 105. The connection pixel packages 120 and the display pixels 140 are disposed on the same side of the circuit substrates 110. Each of the connection pixel packages 120 and each of the display pixels 140 has a pixel unit, e.g., red, blue, and green micro light emitting diode (Micro LED) chips for displaying, and a light emitting surface of all pixel units is coplanar. In detail, a light emitting surface of the pixel unit of the connection pixel package 120 and a light emitting surface of the pixel unit of the display pixel 140 are coplanar.

Therefore, according to this embodiment, a large size display panel 100 is formed by disposing the connection pixel packages 120 and electrically connecting the display modules 105 to tile. As a result, the display panel 100 of the disclosure may be applied to large size or high pixel density tiling displays with higher yields and lower costs than non-tiling displays. According to this embodiment, sizes of the connection pixel packages 120 are the same. It should be noted that the structure of the connection pixel package 120 in unit size may be the same as the structure of the display pixel 140 of the display module 105 in unit size. The connection pixel package 120 is used as a display pixel like the display pixel 140, and is consistent in appearance, but the disclosure is not limited thereto.

Figure 2:
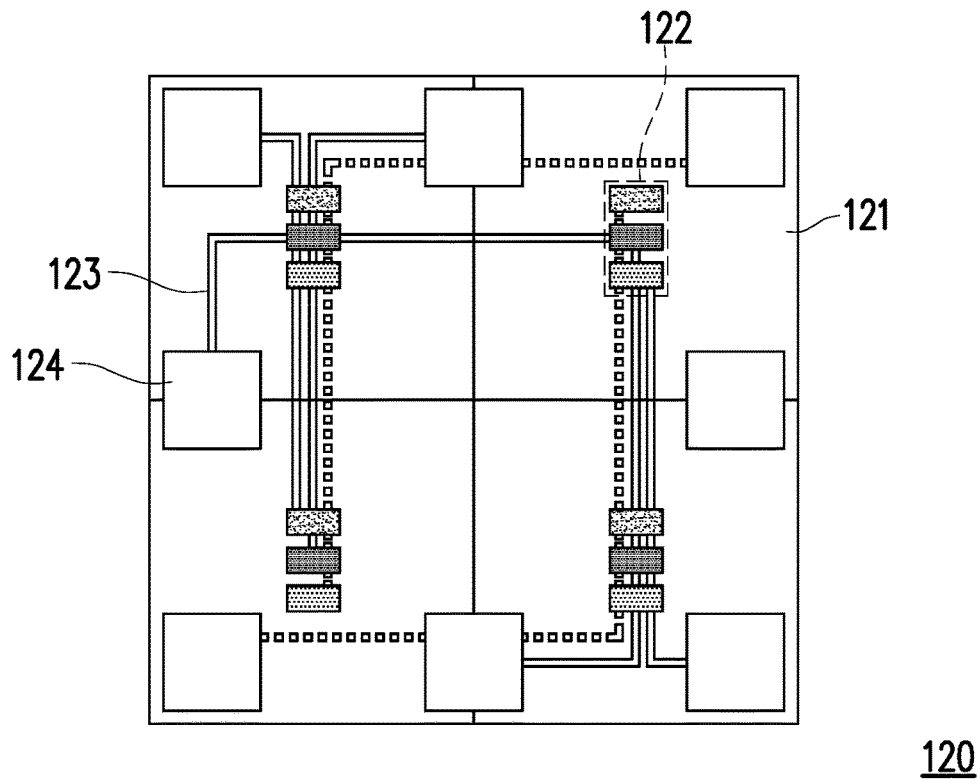
FIG. 2 is a schematic top view of a connection pixel package according to an embodiment of the disclosure.
Figure 3:
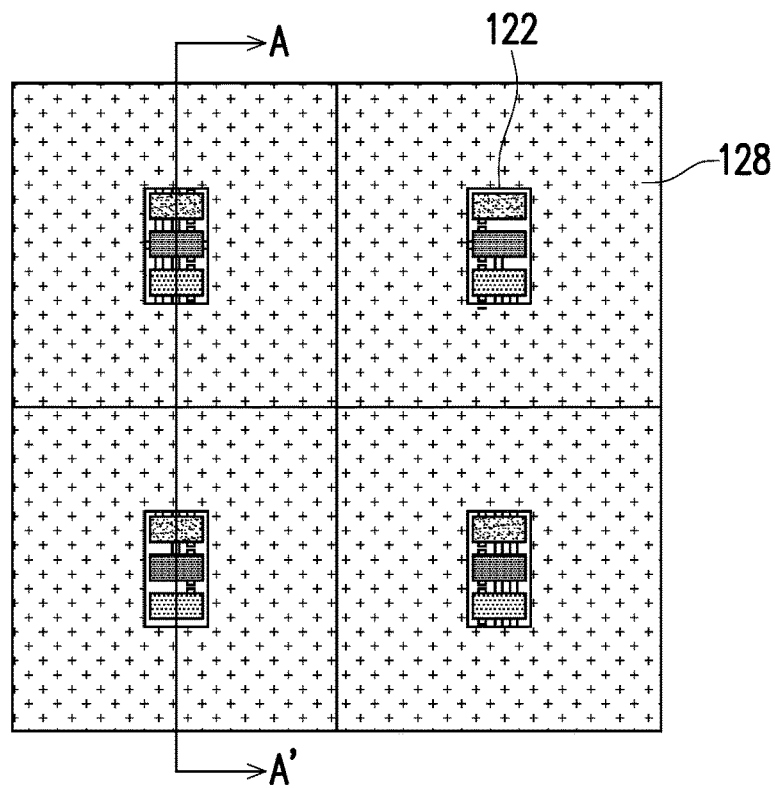
FIG. 3 is a schematic top view of the connection pixel package of FIG. 2 covered by a light-shielding layer.
Figure 4:
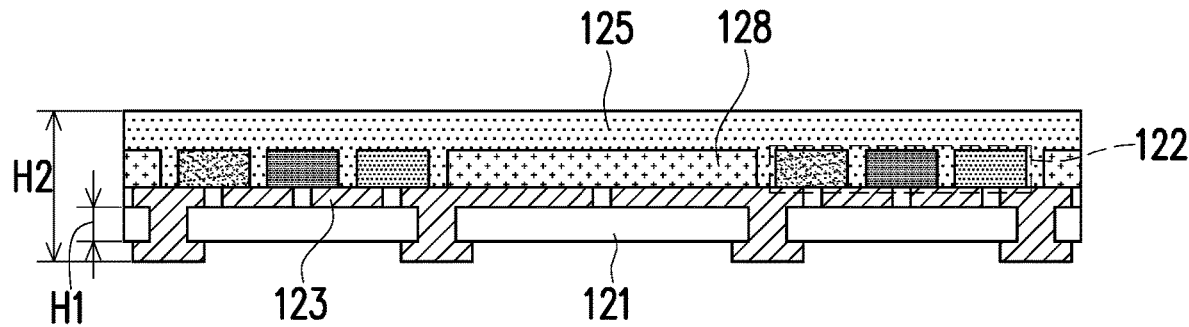
FIG. 4 is a schematic cross-sectional view of the connection pixel package of FIG. 3 along a line A-A'.

FIG. 2 is a schematic top view of a connection pixel package according to an embodiment of the disclosure. FIG. 3 is a schematic top view of the connection pixel package of FIG. 2 covered by a light-shielding layer. FIG. 4 is a schematic cross-sectional view of the connection pixel package of FIG. 3 along a line A-A'. Referring to FIG. 1A to FIG. 4, in detail, the connection pixel package 120 includes at least one first pixel unit 122 used as a partial display unit of the display panel 100. The first pixel unit 122 includes, for example, red, blue, and green micro light emitting diodes (Micro LEDs), but the disclosure is not limited thereto. A number of the first pixel unit 122 may be plural. For example, according to this embodiment, the number of the first pixel unit 122 in one connection pixel package 120 is four, and the first pixel units 122 are arranged in an array, but the disclosure is not limited thereto. Similarly, the display pixel 140 of the display modules 105 has at least one second pixel unit (not shown), and the first pixel unit 122 and the second pixel unit are arranged in an array, and the disclosure is not limited thereto.

More specifically, according to this embodiment, the connection pixel package 120 further includes a carrier 121, a circuit structure 123, a common electrode 124, a light-shielding layer 128, and an encapsulation layer 125. For ease of illustration and clarity, the encapsulation layer 125 is omitted in FIG. 3. The first pixel unit 122, the circuit structure 123, the common electrode 124, and the light-shielding layer 128 are disposed on the carrier 121, and the encapsulation layer 125 is disposed on the first pixel unit 122 and the light-shielding layer 128. According to this embodiment, the carrier 121 is a sheet made of a dielectric material, e.g., a polymer. Therefore, in the process condition setting of the connection pixel packages 120 according to the embodiment, Mohs hardness of the carrier 121 is different from and less than the Mohs hardness of general ceramic substrates (e.g. $Al_2O_3$ or AlN) silicon substrates, and glass substrates. The Mohs hardness is, for example, less than or equal to 6 according to the disclosure. On the other hand, in terms of structural dimensions, a maximum height H1 of the carrier 121 is less than or equal to 20 μm, and a maximum height H2 of the whole connection pixel package 120 is less than or equal to 100 μm. In other words, the connection pixel packages 120 according to this embodiment are made directly by a semiconductor process, which has a higher arrangement density than a conventional chip packaging structure disposed on a circuit substrate, and does not require a cutting process. Precision of the connection pixel packages 120 may be achieved within a tolerance of plus or minus 20 μm, resulting in better yields. In addition, the circuit structure 123 is connected between the first pixel unit 122 and the common electrode 124 for controlling the pixels. The circuit structure 123 and the carrier 121 are circuit layers. A conductive material may be formed by a deposition process, and then the circuit structure 123 and the carrier 121 may be formed by photolithography, etching, and other similar patterning processes. The light-shielding layer 128 is disposed in a gap between the first pixel unit 122 to expose the first pixel unit 122 and the thickness of the light-shielding layer 128 may be the same as or slightly higher than the height of the first pixel units 122 to provide a light-absorbing effect, but the disclosure is not limited thereto. According to different embodiments, the light-shielding layer 128 may be designed to be filled between a plurality of chips in the first pixel unit 122 to expose a top surface of the chip, but the disclosure is not limited thereto. The encapsulation layer 125 may be any type of adhesive with light-transmitting properties, and may be formed on the light-shielding layer 128 and the first pixel unit 122, for example, by a coating method, an adhesive method, a sol-gel method, or a press method to be a light-transmitting packaging material. According to this embodiment, Young's modulus of the encapsulation layer 125 may be greater than or equal to 1 GPa to reduce the possibility of damage to the first pixel unit 122 and the circuit structure 123 encapsulated by the encapsulation layer 125.

Figure 5:
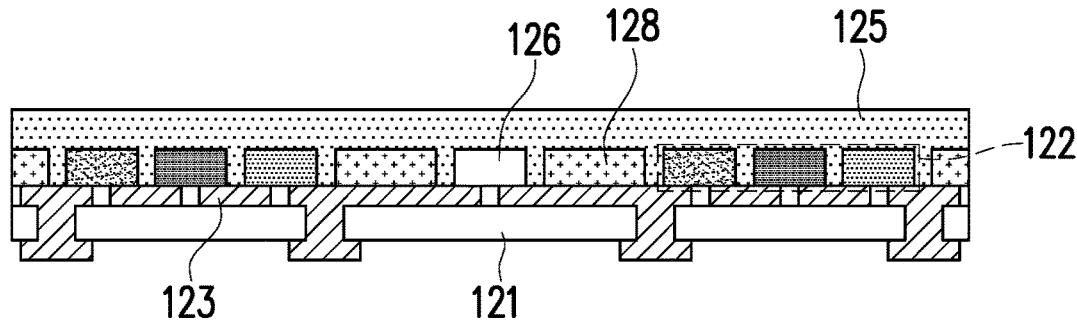
FIG. 5 is a schematic cross-sectional view of a connection pixel package according to another embodiment of the disclosure.

FIG. 5 is a schematic cross-sectional view of a connection pixel package according to another embodiment of the disclosure. Referring to FIG. 5, a connection pixel package 120A shown in this embodiment is similar to the connection pixel package 120 shown in FIG. 4. The difference is that, according to this embodiment, the connection pixel package 120A further includes at least one control element 126 electrically connected to the pixel unit 122 for controlling the first pixel unit 122. According to this embodiment, the control element 126 and the first pixel unit 122 are disposed on the same plane. In addition, a number of the control element 126 is less than or equal to a number of the pixel unit 122, but the disclosure is not limited thereto.

Figure 6:
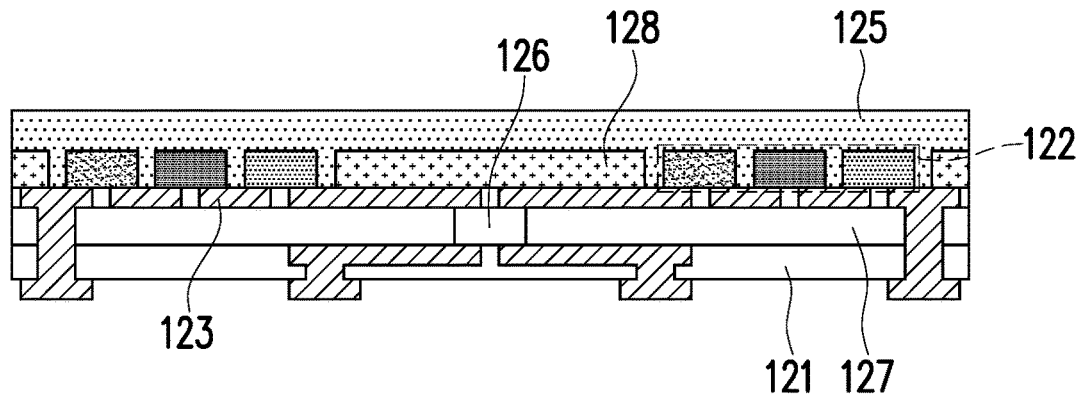
FIG. 6 is a schematic cross-sectional view of a connection pixel package according to another embodiment of the disclosure.

FIG. 6 is a schematic cross-sectional view of a connection pixel package according to another embodiment of the disclosure. A connection pixel package 120B shown in this embodiment is similar to the connection pixel package 120A shown in FIG. 5. The difference is that, according to this embodiment, the connection pixel package 120B further includes a dielectric layer 127 disposed on the carrier 121, and the control element 126 is embedded in the dielectric layer 127.

Similar to the connection pixel package 120, the display pixel 140 may be a display pixel package having a pixel unit. For example, the connection pixel packages 120, 120A, and 120B of any of the embodiments may be selected as the display pixel package. In other words, the structure of the display pixel 140 may be the same as the structure of the connection pixel packages 120, 120A, and 120B. Alternatively, the display pixel 140 may include a pixel unit, including red, blue, and green micro light emitting diode chips directly bonded to the circuit substrate 110 by a chip on board (CoB) method to form the display pixel 140, and the disclosure does not limit the type of the display pixel.

Figure 7A:
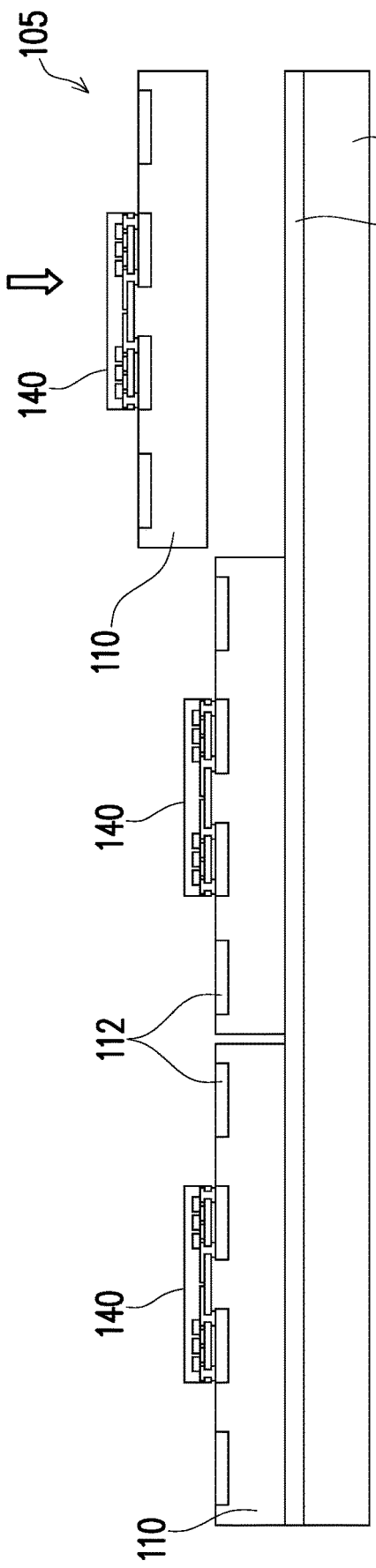
FIG. 7A and FIG. 7B are schematic cross-sectional views of assembly of a display panel according to another embodiment of the disclosure.
Figure 7B:
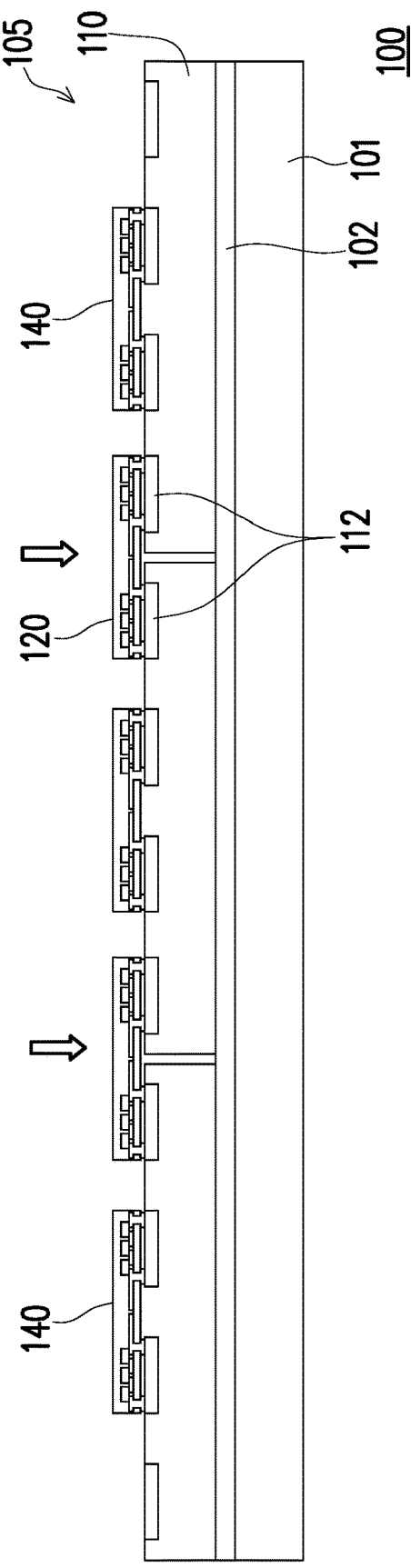

FIG. 7A and FIG. 7B are schematic cross-sectional views of an assembly process of a display panel according to another embodiment of the disclosure. Referring to FIG. 7A and FIG. 7B, according to this embodiment, assembly steps of the display panel 100 may be as follows. First, a plurality of display pixels 140 are provided and transferred to plural circuit substrates 110 in a mass transfer manner to form a plurality of display modules 105. Then, the display modules 105 are disposed on the bottom plate 101 to tile. Next, at connection positions of the display modules 105, the connection pixel package 120 is disposed on the connection electrodes 112 on adjacent circuit substrates 110 to connect at least two adjacent display modules 105 respectively. According to the embodiment shown in FIG. 1A, a part of the connection pixel packages 120 connect two adjacent display modules 105, and a part of the connection pixel packages 120 connect four adjacent display modules 105, and the disclosure is not limited thereto. Thus, in contrast to conventional practice, a large size display panel 100 may be formed by disposing the connection pixel packages 120 to tile a plurality of display modules 105 according to this embodiment. As a result, the display panel 100 of the disclosure may be applied to large size or high pixel density tiling displays with higher yields and lower costs than non-tiling displays. The assembly process of the display panel 100 according to this embodiment may be applied to all the foregoing embodiments. For example, the display modules 105 shown in FIG. 7A and FIG. 7B may also include four display pixels 140 as shown in FIG. 1A, or other designs of various numbers or sizes, and the disclosure is not limited thereto. On the other hand, according to this embodiment, the display panel 100 further includes an intermediate layer 102. The intermediate layer 102 is disposed on the bottom plate 101 before the step of disposing a plurality of display modules 105 to the bottom plate 101 for the subsequent steps. The intermediate layer 102 is, for example, polymer or silicone that may be used to adhere the display modules 105 on the bottom plate 101.

Figure 8:
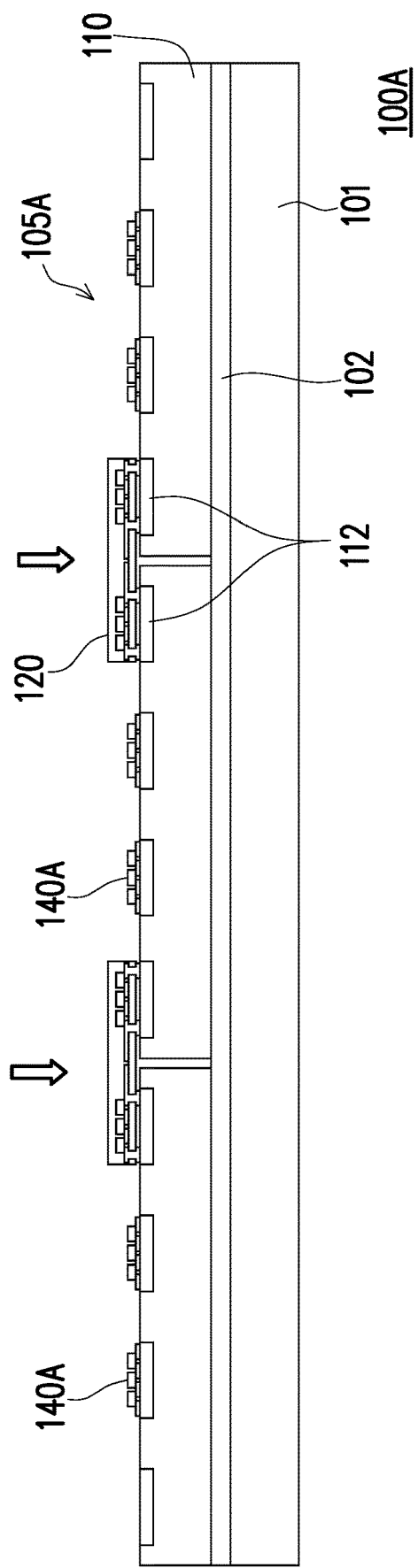
FIG. 8 is a schematic cross-sectional view of a display panel according to another embodiment of the disclosure.

FIG. 8 is a schematic cross-sectional view of a display panel according to another embodiment of the disclosure. Referring to FIG. 8, a display panel 100A shown according to this embodiment is similar to the display panel 100 shown in FIG. 7B. The difference is that, according to this embodiment, a second pixel unit of a display pixel 140A is formed by directly bonding red, blue, and green micro light emitting diode chips to the circuit substrate 110 as a pixel unit by the chip on board (COB) method to form the display modules 105.

Figure 9:
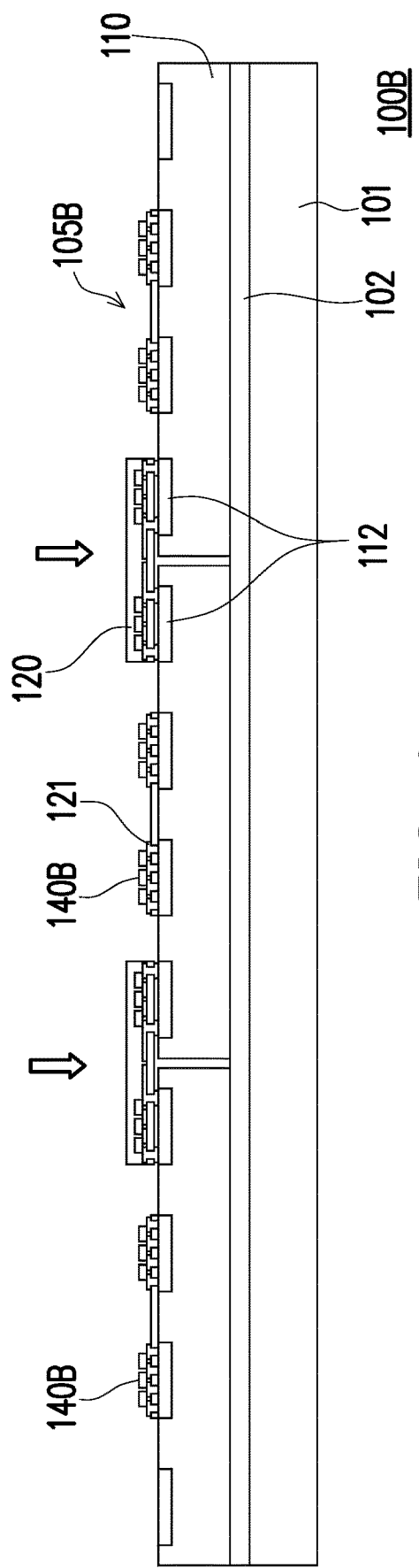
FIG. 9 is a schematic cross-sectional view of a display panel according to another embodiment of the disclosure.

FIG. 9 is a schematic cross-sectional view of a display panel according to another embodiment of the disclosure. Referring to FIG. 9, a display panel 100B shown in this embodiment is similar to the display panel 100A shown in FIG. 8. The difference is that, according to this embodiment, a display pixel 146B further includes a carrier 121 such as the connection pixel package 120, which is designed to further facilitate increasing a position of a light emitting surface of the pixel unit in the display pixel 140B and further co-planarizing with the light emitting surface of the pixel unit in the connection pixel package 120.

Figure 10A:
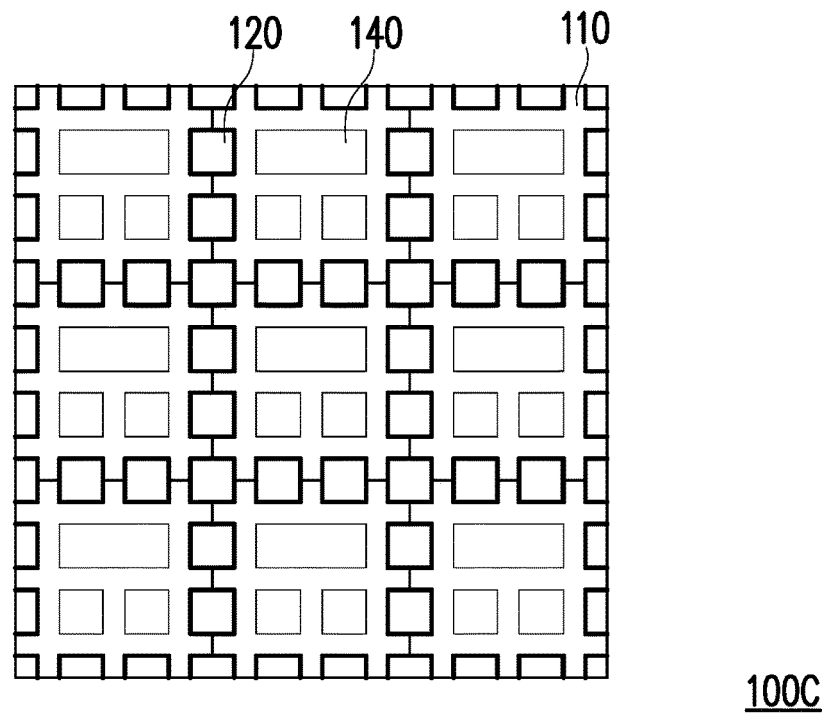
FIG. 10A to FIG. 10F are schematic top views of display panels according to different embodiments of the disclosure.
Figure 10B:
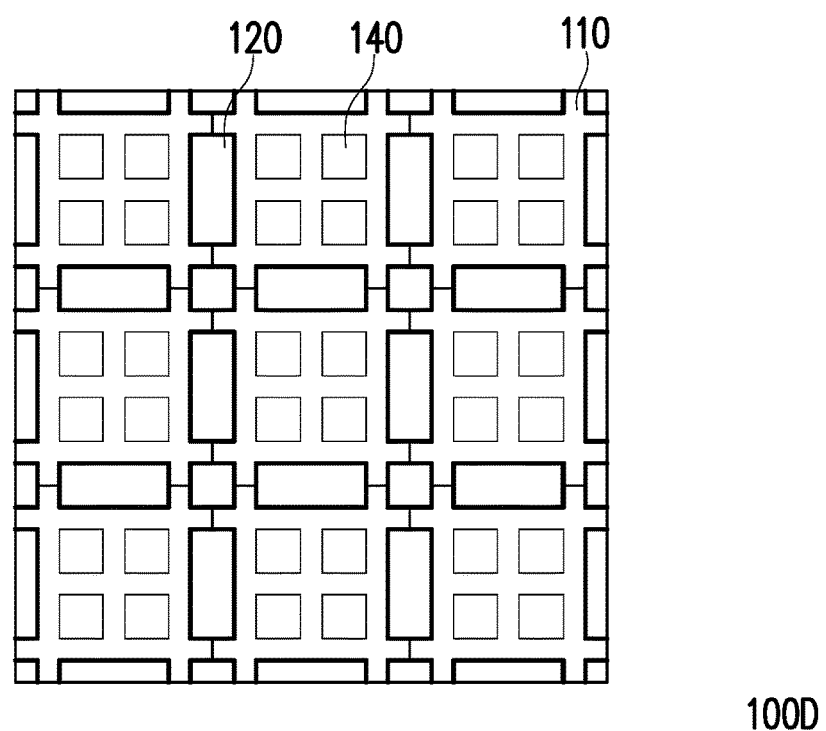

FIG. 10A to FIG. 10F are schematic top views of display panels according to different embodiments of the disclosure. Referring to FIG. 10A to FIG. 10F, according to different embodiments, a coverage area and distribution of the connection pixel package 120 and the display pixel 140 may be designed differently depending on the situation. The coverage of the connection pixel packages 120 is shown in bold lines, and the coverage of the display pixels 140 is shown in fine lines. The coverage area refers to an area covered by all the pixels, while a pixel package or pixel unit may be made from different sizes of carriers with different numbers of pixel units. In other words, it may be designed to have a single pixel unit or a plurality of pixel units in a single coverage area according to requirements, and the disclosure is not limited thereto. For example, in the same display device, the connection pixel packages 120 of the same size and the display pixels 140 of a different size may be disposed, such as a display panel 1000 shown in FIG. 10A. Alternatively, in the same display device, the connection pixel packages 120 of different coverage sizes and the display pixels 140 of the same size may be disposed, such as a display panel 100D as shown in FIG. 10B. However, the disclosure is not limited thereto.

Figure 10C:
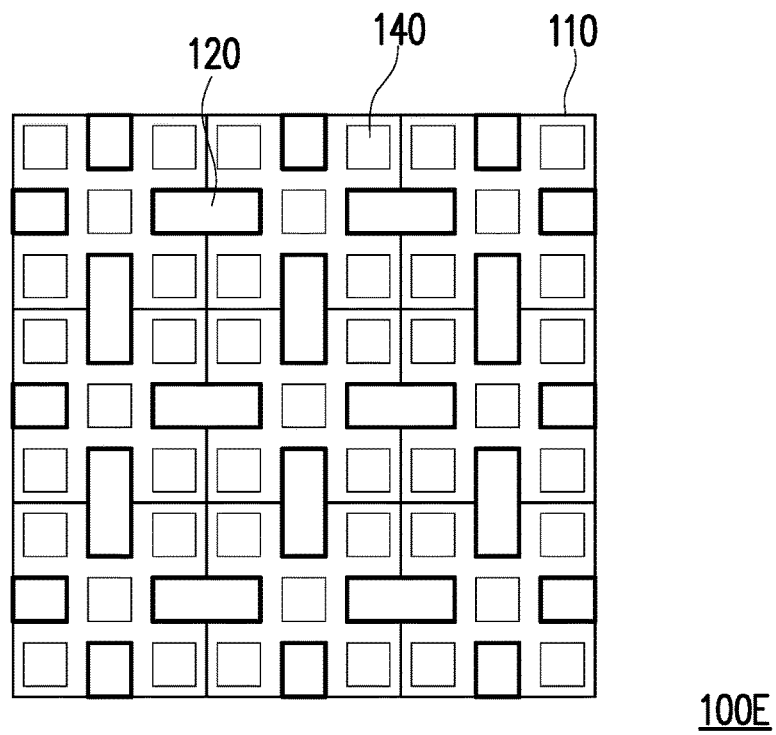
Figure 10D:
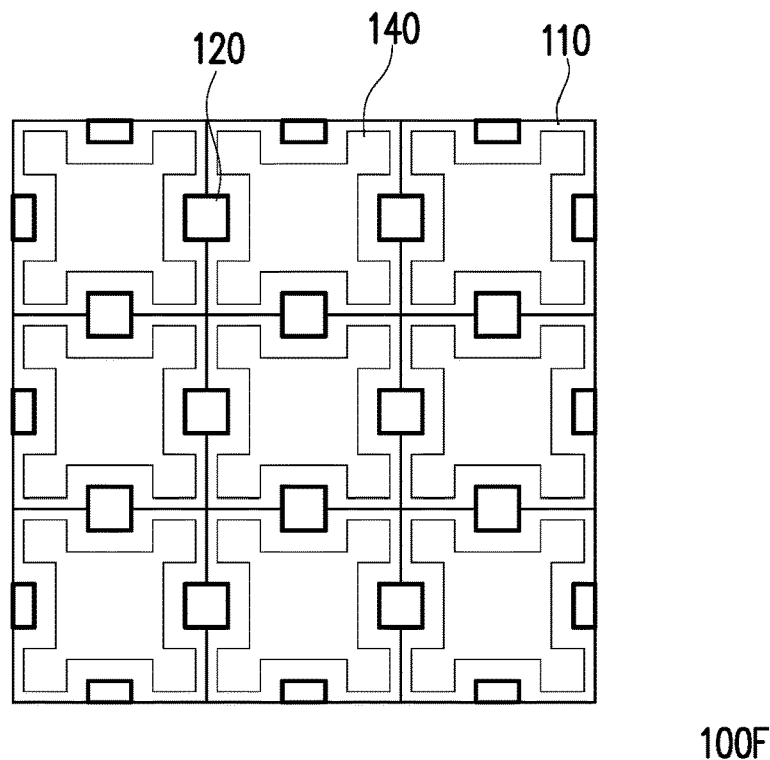
Figure 10E:
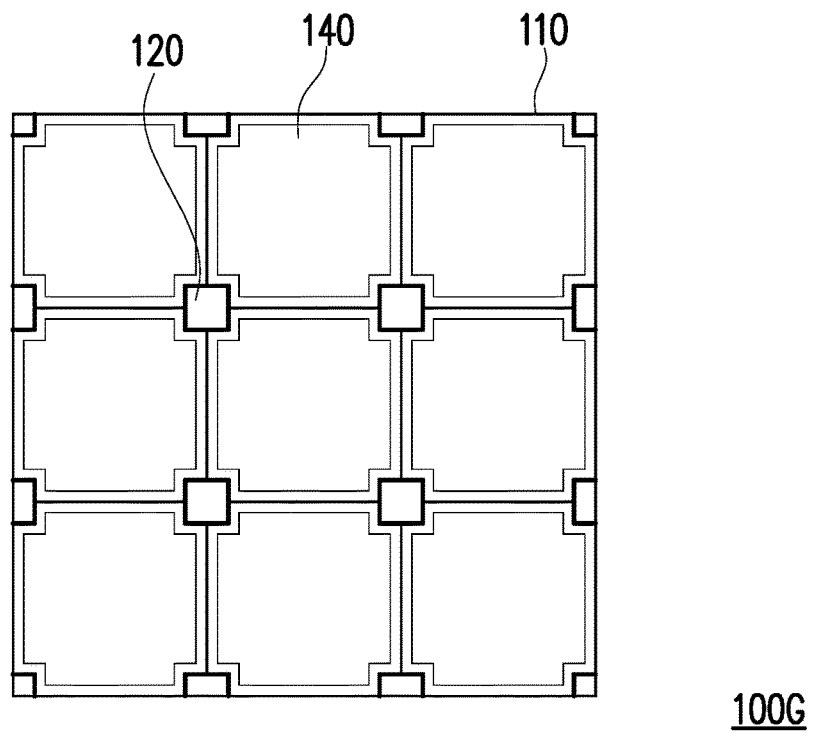
Figure 10F:
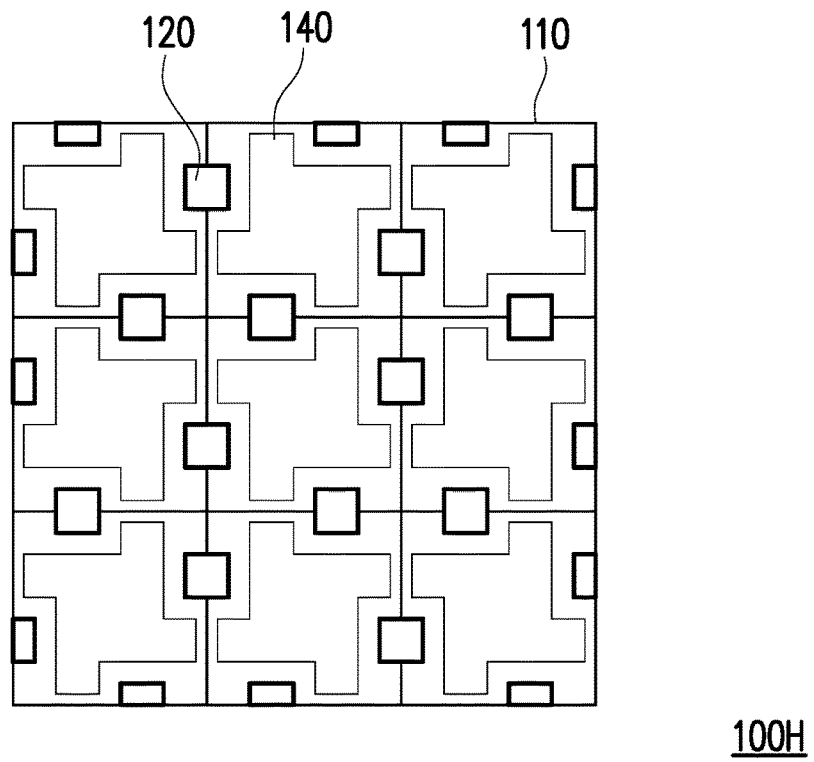

In addition, according to different embodiments, the coverage area of the connection pixel package 120 and the display pixel 140 may vary in size depending on the needs according to different embodiments. Display panels 100F, 100G, and 100H shown in FIG. 10D, FIG. 10E, and FIG. 10F include designs with different coverage areas of the display pixels, and the disclosure is not limited thereto. A position of the connection pixel package 120 may be designed differently according to different needs. For example, the position of the connection pixel package 120 may be designed to be between two adjacent circuit substrates 110, such as display panels 100E, 100F, and 100H as shown in FIG. 10C, FIG. 10D, and FIG. 10F. Alternatively, the position of the connection pixel package 120 may be designed to be between four adjacent circuit substrates 110, such as the display panel 100G shown in FIG. 10E, but the disclosure is not limited thereto.

In summary, in the display panel of the disclosure, a plurality of display modules are disposed on the bottom plate, wherein at least one second pixel unit is disposed on the display modules, and the connection pixel packages include the at least one first pixel unit are electrically connected between adjacent display modules to tile. As a result, there are pixel units that can display images between adjacent display modules, capable of being applied to large size or high pixel density tiling displays with higher yields and lower costs than non-tiling displays.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A display panel comprising:
   a bottom plate;
   a plurality of display modules tiled in an array arrangement on the bottom plate, wherein each of the display modules comprises:
      a circuit substrate having a plurality of connection electrodes; and
      a plurality of display pixels disposed on the circuit substrate, wherein at least one of the display pixels has at least one second pixel unit; and
   a plurality of connection pixel packages, wherein each of the connection pixel packages comprises at least one first pixel unit, and the connection pixel packages are disposed on the connection electrodes of the adjacent circuit substrates to connect the display module, wherein a light emitting surface of the at least one first pixel unit and a light emitting surface of the at least one second pixel unit are coplanar.

2. The display panel according to claim 1, wherein a number of the at least one first pixel unit of the connection pixel packages is plural.

3. The display panel according to claim 1, wherein the at least one first pixel unit and the at least one second pixel unit comprise red, blue, and green micro light emitting diode chips.

4. The display panel according to claim 1, wherein a maximum height of the connection pixel packages is less than or equal to 100 μm.

5. The display panel according to claim 1, wherein Mohs hardness of the connection pixel packages is less than or equal to 6.

6. The display panel according to claim 1, wherein the connection pixel packages further comprise a carrier, the at least one first pixel unit is disposed on the carrier, and a maximum height of the carrier is less than or equal to 20 μm.

7. The display panel according to claim 1, wherein the connection pixel packages further comprise at least one control element electrically connected to the at least one first pixel unit.

8. The display panel according to claim 7, wherein a number of the at least one control elements less than or equal to a number of the at least one first pixel unit.

9. The display panel according to claim 1, wherein sizes of the connection pixel packages are the same.

10. The display panel according to claim 1, wherein the at least one second pixel unit is formed by bonding the micro light emitting diode chips on the circuit substrate.

11. The display panel according to claim 10, wherein a number of the at least one second pixel unit is plural.

12. The display panel according to claim 1, wherein the display pixel comprises at least one display pixel package, and the at least one display pixel package comprises the at least one second pixel unit.

13. The display panel according to claim 12, wherein a number of the at least one second pixel unit is plural.

14. The display panel according to claim 12, wherein a structure of the connection pixel packages in unit size is the same as a structure of the display pixel packages in unit size.

15. The display panel according to claim 1, wherein the display pixel packages and the connection pixel packages are disposed on the same side of the circuit substrates.

* * * * *